(12) United States Patent
Payack, Jr.

(10) Patent No.: US 7,085,662 B2
(45) Date of Patent: Aug. 1, 2006

(54) POWER QUALITY INDICATOR

(75) Inventor: Walter P. Payack, Jr., Suwanee, GA (US)

(73) Assignee: Siemens Energy & Automation, Inc., Alpharetta, GA (US)

( * ) Notice: Subject to any disclaimer, the term of this patent is extended or adjusted under 35 U.S.C. 154(b) by 53 days.

(21) Appl. No.: 10/909,177

(22) Filed: Jul. 30, 2004

(65) Prior Publication Data

US 2006/0025944 A1 Feb. 2, 2006

(51) Int. Cl.
G01R 13/00 (2006.01)

(52) U.S. Cl. .......................... 702/66; 361/24; 361/55; 702/61

(58) Field of Classification Search ............. None
See application file for complete search history.

(56) References Cited

U.S. PATENT DOCUMENTS

| | | | | |
|---|---|---|---|---|
| 4,106,071 A * | 8/1978 | Sun et al. | ..................... | 361/79 |
| 5,089,928 A * | 2/1992 | Durivage et al. | ............. | 361/94 |
| 5,148,360 A | 9/1992 | Nguyen | ..................... | 363/48 |
| 5,386,183 A * | 1/1995 | Cronvich et al. | ........... | 318/434 |
| 5,448,442 A * | 9/1995 | Farag | ......................... | 361/24 |
| 5,627,717 A * | 5/1997 | Pein et al. | .................... | 361/95 |
| 5,822,165 A | 10/1998 | Moran | ......................... | 361/78 |
| 5,890,097 A | 3/1999 | Cox | ............................. | 702/67 |
| 5,936,817 A | 8/1999 | Matsko et al. | ................ | 361/72 |
| 6,005,757 A | 12/1999 | Shvach et al. | ................ | 361/64 |
| 6,038,516 A * | 3/2000 | Alexander et al. | ............ | 702/67 |
| 6,118,639 A * | 9/2000 | Goldstein | ..................... | 361/55 |
| 6,167,329 A | 12/2000 | Engel et al. | ................ | 700/293 |
| 6,175,780 B1 | 1/2001 | Engel | .......................... | 700/293 |
| 6,185,482 B1 | 2/2001 | Egolf et al. | ................. | 700/293 |
| 6,185,508 B1 | 2/2001 | Van Doorn et al. | ........... | 702/60 |
| 6,289,267 B1 * | 9/2001 | Alexander et al. | .......... | 700/286 |
| 6,292,717 B1 * | 9/2001 | Alexander et al. | .......... | 700/293 |
| 6,516,279 B1 | 2/2003 | Jansen et al. | ................. | 702/66 |
| 2002/0032535 A1 * | 3/2002 | Alexander et al. | ............ | 702/64 |
| 2005/0099131 A1 * | 5/2005 | Amarillas et al. | ............ | 315/64 |
| 2005/0132241 A1 * | 6/2005 | Curt et al. | ................... | 713/300 |
| 2005/0235174 A1 * | 10/2005 | Curt et al. | ................... | 713/340 |

\* cited by examiner

*Primary Examiner*—Carol S. W. Tsai
(74) *Attorney, Agent, or Firm*—Foley & Lardner LLP

(57) ABSTRACT

There is provided a method and a power quality indicator coupled to an electrical circuit. The indicator comprises the summing device configured to received a sensed wave form from the electrical circuit, including at least one voltage wave form. A summing device is configured to provide a summed output voltage. A low pass filter (LPF) is electrically coupled to the summing device and configured to receive a summed output voltage from the summing device. The LPF is configured to provide a LPF voltage. A microprocessor is configured to receive the sum upward voltage the LPF voltage, compute an RMS voltage value for each of the summed output voltage, determine the difference of such RMS voltage values and generate a signal representative of the difference of the RMS voltage values, wherein the signal is proportional to the harmonic content in the electrical circuit.

24 Claims, 2 Drawing Sheets

POWER QUALITY INDICATOR

BACKGROUND OF THE INVENTION

The present invention relates generally to the field of electrical devices, such as circuit breakers and more particularly to a power quality indicator that monitors harmonics in an electrical circuit.

In general the function of a circuit breaker is to electrically engage and disengage a selected circuit from an electrical power supply. This function occurs by engaging and disengaging a pair of operating contacts for each phase of the circuit breaker. The circuit breaker provides protection against persistent overcurrent conditions and against the very high currents produced by short circuits. Typically, one of each pair of the operating contacts are supported by a pivoting contact arm while the other operating contact is substantially stationary. The contact arm is pivoted by an operating mechanism such that the movable contact supported by the contact arm can be engaged and disengaged from the stationary contact.

There are two modes by which the operating mechanism for the circuit breaker can disengage the operating contacts: the circuit breaker operating handle can be used to activate the operating mechanism; or a tripping mechanism, responsive to unacceptable levels of current carried by the circuit breaker, can be used to activate the operating mechanism. For many circuit breakers, the operating handle is coupled to the operating mechanism such that when the tripping mechanism activates the operating mechanism to separate the contacts, the operating handle moves to a fault or tripped position.

To engage the operating contacts of the circuit breaker, the circuit breaker operating handle is used to activate the operating mechanism such that the movable contact(s) engage the stationary contact(s). A motor coupled to the circuit breaker operating handle can also be used to engage or disengage the operating contacts. The motor can be remotely operated.

A typical industrial circuit breaker will have a continuous current rating ranging from as low as 15 amps to over 1200 amps. The tripping mechanism for the breaker usually consists of a thermal overload release and a magnetic short circuit release. The thermal overload release operates by means of a bimetallic element, in which current flowing through the conducting path of a circuit breaker generates heat in the bi-metal element, which causes the bi-metal to deflect and trip the breaker. The heat generated in the bi-metal is a function of the amount of current flowing through the bi-metal as well as for the period of time that that current is flowing. For a given range of current ratings, the bi-metal cross-section and related elements are specifically selected for such current range resulting in a number of different circuit breakers for each current range.

An industrial circuit breaker may also be provided with an electronic trip unit. The electronic trip unit senses overcurrent with amplification circuits which provide corresponding analog inputs to a microprocessor controllers like the bi-metallic element trip unit, the electronic unit will cause a time-delay trip as a function of overcurrent magnitude.

In the event of current levels above the normal operating level of the thermal overload release, it is desirable to trip the breaker without any intentional delay, as in the case of a short circuit in the protected circuit, therefore, an electro-magnetic trip element is generally used. In a short circuit condition, the higher amount of current flowing through the circuit breaker activates a magnetic release which trips the breaker in a much faster time than occurs with the bi-metal heating. It is desirable to tune the magnetic trip elements so that the magnetic trip unit trips at lower short circuit currents at a lower continuous current rating and trips at a higher short circuit current at a higher continuous current rating. This matches the current tripping performance of the breaker with the typical equipment present downstream of the breaker on the load side of the circuit breaker.

In certain situations, it may be advantageous to disconnect an electrical system by opening a circuit breaker in the circuit. Such circumstances can include applications for maintenance and control. It may also be used in applications to prevent use of electrical equipment under a specified or selected voltage.

In the case of the circuit breaker having an electronic trip unit (ETU), the ETU measures the electrical current in each of the phases of the electrical circuit and implements an algorithm based on the dissipation of energy within the electrical system. The algorithm accuracy within the ETU is very dependent upon samples taken during current wave forms cycle to determine $I^2T$. In some cases, the number of samples taken do not take into account the heating of the lines that is generated by the higher than the $7^{th}$ harmonic. It is known that the microprocessors in current ETU's typically sample current wave forms at 32 samples per cycle, which would include as high as the $15^{th}$ harmonic of the wave forms of the electrical system being monitored.

Other means for controlling power flow in power circuits, for example, non-mechanical apparatus, such as SCRs, may benefit from monitoring harmonic content in such power circuit.

Thus there is a need for a power quality indicator monitoring the harmonics in an electrical circuit protected with circuit breakers having ETU capability to alert an operator of excess harmonics present in the system. There is further need for a device and method for determining harmonic content in power circuit and providing a signal proportional to the degree of harmonic content in the power circuit and providing the signal to an electrical device or indicator.

SUMMARY OF THE INVENTION

There is provided a method for determining harmonic content in an electrical circuit and providing a signal proportional to the degree of harmonic content. The method comprises the steps of sensing wave forms with the sensing device in the electrical circuit, including at least one voltage wave form. Summing the wave forms in a summing device providing a low path filter. Providing a microprocessor. Providing an output voltage of the summing device to the volt pass filter and the microprocessor. Computing the RMS value of each of the output voltage of the low pass filter and output voltage of the summing device in the microprocessor. Determining the difference between the two RMS values. Generating a signal from the microprocessor representing the determined difference of the two RMS values, wherein the signal is proportional to the degree of harmonic content in the electrical circuit. Another embodiment includes the step of providing the signal to an indicator which can be an electrical device such as a trip mechanism of the circuit breaker, a light and an audio device.

There is also provided a power quality indicator coupled to an electrical circuit to monitor harmonics. The power quality indicator comprises the summing device configured to received a sensed wave form from the electrical circuit, including at least one voltage wave form. A summing device is configured to provide a summed output voltage. A low pass filter (LPF) is electrically coupled to the summing device and configured to receive a summed output voltage from the summing device. The LPF is configured to provide a LPF voltage. A microprocessor is configured to receive the sum upward voltage the LPF voltage, compute an RMS voltage value for each of the summed output voltage, determine the difference of such RMS voltage values and generate a signal representative of the difference of the RMS voltage values, wherein the signal is proportional to the harmonic content in the electrical circuit.

There is also provided a circuit breaker coupled to an electrical circuit. The circuit breaker includes an operating mechanism coupled to a movable contact. The circuit breaker comprises an electronic trip unit (ETU) coupled to the operating mechanism and a power quality indicator coupled to the electrical circuit. The power quality indicator comprises a summing device configured to receive a sensed wave form from the electrical circuit, including at least one voltage wave form. The summing device is configured to provide a summed output voltage. A low pass filter (LPF) electrically coupled to the summing device and configured to receive the sum output voltage from the summing device. The low pass filter is configured to provide an LPF voltage. A microprocessor is configured to receive the summed output voltage and the LPF voltage, compute an RMS voltage value for each of the summed output voltage and LPF voltage, determine the difference of such RMS voltage values, and generate a signal representative of the difference of the two RMS voltage values, wherein the signal is proportional to the harmonic content in the electrical circuit.

There is also provided a power quality indicator monitoring voltage of an electrical device connected to a power circuit. The power quality indicator includes a board and an electrical circuit mounted on the board. The electrical circuit is coupled to the electrical device and the power circuit. The electrical circuit includes a low pass filter (LPF) configured to provide an LPF voltage corresponding to the voltage drop across the LPF directly proportional to the degree of harmonic content sensed by the electrical circuit in the power circuit. A signal device is coupled to the electrical circuit and configured to provide one of an audio indication, visual indication and network instruction. The low pass filter can be a fourth order low pass filter.

DETAILED DESCRIPTION OF THE EXEMPLARY EMBODIMENTS

Figure 1:
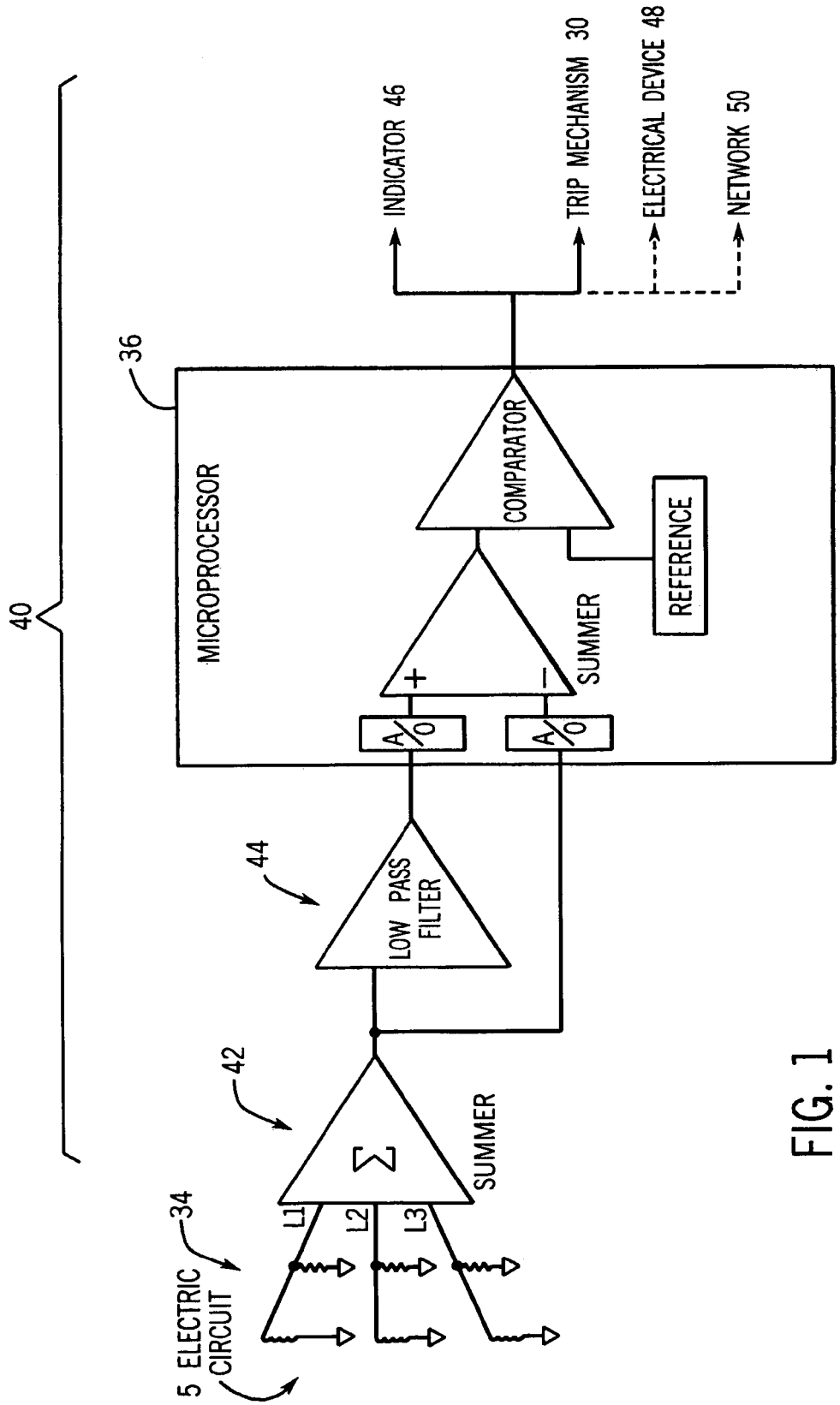
FIG. 1 is a schematic diagram of an exemplary embodiment of a power quality indicator coupled to a multi-phase electrical circuit.

FIG. 1 generally illustrates a circuit breaker 10, which can be a molded case circuit breaker. The circuit breaker 10 is of the type which typically includes an operating mechanism 20 that is coupled to a pivoting member with a handle. The pivoting member and handle are movable between an ON position, OFF position and TRIPPED position. The exemplary circuit breaker 10 can be a three pole breaker having three sets of contacts for interrupting current in each of the three respective electrical transmission phases. In an exemplary embodiment, each phase includes separate breaker contacts and a separate trip mechanism. A center pole circuit breaker includes an operating mechanism which controls the switching of all three poles of the circuit breaker. Although an embodiment of the present invention is described in the context of a single phase circuit breaker, it is contemplated that it may be practiced in a three phase or in other multi-phase circuit breakers.

The handle of the circuit breaker is operable between the ON and OFF positions to enable the contact operating mechanism 20 to engage and disengage a movable contact 24 and a stationary contact 22 for each of the phases such that the line terminal 26 and the load terminal 28 of each phase can be electrically connected and disconnected.

A trip assembly 30 which typically includes a bi-metallic element and a magnetic short circuit release is coupled between the line 26 and load 28 terminals of the circuit breaker 10. The trip assembly can include an electronic trip unit 32 coupled to a sensing circuit 34.

To monitor the harmonic content of an electrical circuit, a power quality indicator circuit 40 coupled to the electronic trip unit 32 is necessary. The power quality indicator circuit 40 monitors the electrical circuit and determines if excess harmonics are present in the system. The excess of harmonic content may mean a faulty motor or a generator or a failing transformer is in the system. Such condition may not be sufficient to have the electronic trip unit 32 trip the circuit breaker 10. However, providing an indication to an operator that such excess harmonics exist can assist in preventing damage to the components in the electrical circuit being protected by the circuit breaker 10 having the power quality indicator circuit 40 incorporated.

Harmonic content in electrical circuits is typically expressed in terms of percentage of the total harmonic distortion (% THD) and is calculated using a formula for an odd set of three harmonics A3, A5 and A7 which are the primary harmonics in an electrical system. The total harmonic distortion is calculated with a well known formula and the individual harmonic magnitudes are also computed from a well known formula. However, the computation of each of the harmonics impacts adversely on the microprocessor in the ETU 32 which impacts on the execution time otherwise needed to perform the basic protection algorithms normally performed by the ETU 32. A digital signal processor can be employed, however, that would add significant cost to the ETU 32. It should be understood that other sensitive electronic equipment, for example computers, measuring equipment and the like, may be affected by the harmonics on a power circuit. Identification of harmonic loads and an indication that adverse harmonics are present in the power circuit is important to establishing system reliability.

The power quality indicator circuit disclosed provides a method of approximating the total harmonic distortion without impacting the processing time within the microprocessor of the ETU and providing a visual communication of the existence of adverse harmonics on the power circuit being monitored.

The power quality indicator circuit 40 employs a fourth order, low pass filter. The input to the low pass filter is a power system wave form that contains the fundamental and harmonic frequencies existing on the electrical circuits being protected by the circuit breaker 10 or other electrical device.

The exemplary embodiment of a power quality indicator circuit 40 is illustrated in FIG. 1. The power quality indicator circuit 40 is coupled to an electrical circuit 5. In sensing the circuit, it is coupled to the electrical circuit 5 to sense wave forms including at least one voltage wave form. The sensing circuit 34 can include current transformers with each phase of a multi-phase electrical circuit 5 being monitored. The sensed wave form on each phase of the electrical circuit 5 is inputted to a summing circuit 42. The summing circuit sums the fundamental frequency wave form (60 HZ) with the $3^{rd}$, $5^{th}$, and $7^{th}$ harmonic wave forms from the electrical circuit 5. The output from the summing circuit 42 (X3-out) to the input of a low pass filter 44.

The low pass filter (LPF) 44 is electrically coupled to the summing device 42 and configured to receive the sum upward voltage from the summing device 42. The LPF is configured to provide an LPF voltage. The LPF voltage is inputted into an analog/digital input of a microprocessor 36. The microprocessor 36 includes a summing device to sample the wave forms received from the low pass filter 44. The received wave forms are converted to an RMS voltage for each of the summed output voltage and the LPF voltage. A comparator determines the difference between such RMS voltage values. The RMS value of the summation of such wave forms, represents the full set of harmonics of the power system wave form. The RMS value of the low pass filter voltage represents the approximation of the fundamental frequency wave form. Software in the microprocessor 36 subtracts the two RMS values to arrive at a number that represents the RMS value of the sum of all the harmonics in the electrical circuit 5 and generates a signal representative of the difference of the two RMS voltage values. The signal is proportional to the harmonic content in the electrical circuit 5.

The electrical signal generated then is inputted to an indicator 46, an electrical device 48 such as a trip mechanism 30 of the circuit breaker 5 and the signal can also be inputted into a network 50. Such network access would allow a remote user to view specific loads in the electrical circuit 5 and to monitor the harmonic content of individual loads in the circuit. The electrical device 48 can be also a visual indicator such as on a computer screen to represent our distribution system and indicating the location of harmonic content graphically for user consideration.

The low pass filter 44 and the microprocessor 36 can be mounted on a conventional circuit board and housed in the electronic trip unit 32 which is coupled to the circuit breaker 10. It is also contemplated that the power quality circuit 40 can be external to the circuit breaker and provide a signal to electrical devices other than a circuit breaker. Such other electrical devices can be an automatic transfer switch, a power monitoring equipment, energy management systems, adjustable frequency drives, and building automation systems.

The variety of indicators 46 can be provided such as signal lights, computer screen icons or text, or audio devices all that can be monitored by a user on-site, or remotely over a network 50. A panel board can have group mounted LED indication display board coupled to various electrical apparatus in the power circuit being monitored. Such display board would indicate to a user, either on-site or remotely, that harmonics exist on the power circuit and loads which generate adverse harmonics could be visually identified, allowing for a realignment of the power circuit. In other words, critical loads could be separated from the power circuit or the harmonics causing load could be removed from the power circuit. Removal could be performed electronically, for example, by tripping a circuit breaker or other switching device, or physically removing a device.

Figure 2:
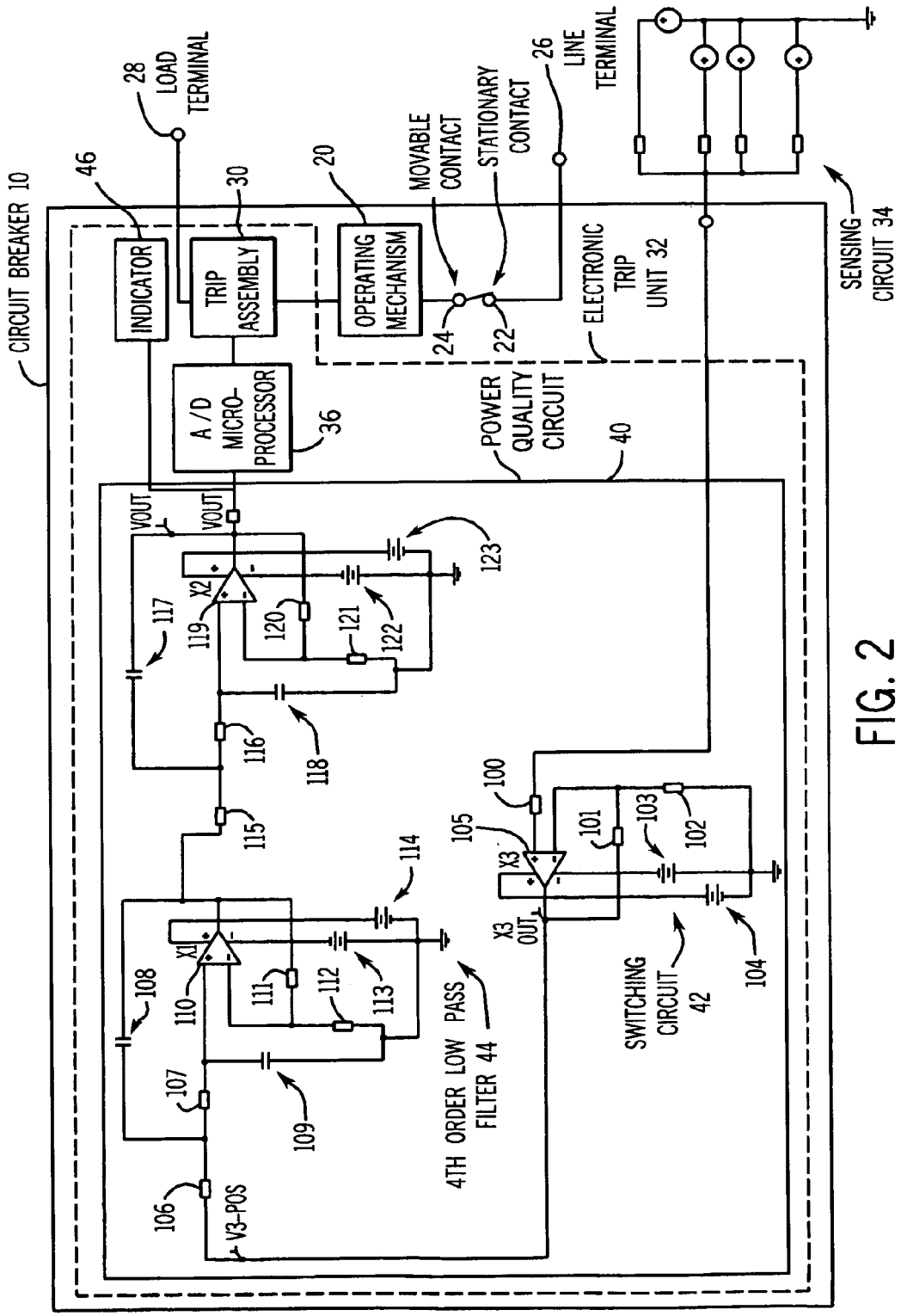
FIG. 2 is a diagram of an exemplary embodiment of a circuit breaker having an operating mechanism, stationary and moving contacts, a line terminal, load terminal, a trip assembly and an exemplary embodiment of a power quality indicator apparatus with an electrical circuit coupled to a latch assembly.

FIG. 2 illustrates a circuit breaker including an electronic trip unit 32 having a power quality circuit 40 incorporated therein. The signal from the microprocessor 36 to the trip assembly 30 of the electronic trip unit 32 will cause the trip assembly 30 to engage a trip bar causing the release of a mechanism latch in the operating mechanism 20 of the circuit breaker 10. The operating mechanism 30 then activates the movable contact 24 to move away from the stationary contact 22 and opens the circuit between the load terminal 28 and the line terminal 26 to which the circuit breaker 10 is connected.

Table 1 sets forth component values for an exemplary embodiment of a power quality circuit depicted in FIG. 2. It should be understood that the various values of the power quality circuit can vary from those shown in Table 1 as determined by the user and designer of the quality circuit 40.

TABLE 1

Exemplary Embodiment of A Power Quality Indicator Circuit in an Electronic Trip Unit of a Circuit Breaker

| Element Number | |
| --- | --- |
| 100 = | 25k ohms |
| 101 = | 2k ohms |
| 102 = | 2k ohms |
| 103 = | 5 volts |
| 104 = | 5 volts |
| 105 = | LM258/NS |
| 106 = | 22k ohms |
| 107 = | 22k ohms |
| 108 = | 200 n |
| 109 = | 100 n |
| 110 = | LM258/NS |
| 111 = | 2k ohms |
| 112 = | 20k ohms |
| 113 = | 5 volts |
| 114 = | 5 volts |
| 115 = | 10k ohms |
| 116 = | 20k ohms |
| 117 = | 200 n |
| 118 = | 100 n |
| 119 = | LM258/NS |
| 120 | 2k ohms |
| 121 | 20k ohms |
| 122 | 5 volts |
| 123 | 5 volts |

Note:
All resistors are 1%. All capacitors are 10%.

While the embodiments illustrated in the figure and described above are presently preferred, it should be understood that these embodiments are offered by way of example only. The power quality indicator is not intended to be limited to any particular embodiment, but it is intended to extend to various modifications that nevertheless fall within the scope of the intended claims. For example, it is contemplated that the trip mechanism having a bi-metal trip unit or an electronic trip unit with a load terminal can be housed in a separate housing capable of mechanically and electrically connecting to another separate housing containing the operating mechanism and line terminal of the circuit breaker. Other modifications will be evident to those with ordinary skill in the art.

What is claimed is:

1. A method for determining harmonic content in an electrical circuit and providing a signal proportional to the degree of harmonic content, the method comprising the steps of:

sensing waveforms with a sensing device in the electrical circuit, including at least one voltage waveform;

summing the waveforms in a summing device;

providing a low pass filter;
providing a microprocessor;
providing output voltage of the summing device to the low pass filter and the microprocessor;
computing the RMS value of each of the output voltage of the low pass filter and output voltage of the summing device in the microprocessor;
determining the difference between the two RMS values; and
generating a signal from the microprocessor representing the determined difference of the two RMS values, wherein the signal is proportional to the degree of harmonic content in the electrical circuit.

2. The method of claim 1, including the step of providing the signal to an indicator.

3. The method of claim 1, including the step of providing the signal to an electrical device.

4. The method of claim 3, wherein the electrical device is a trip mechanism of a circuit breaker.

5. The method of claim 2, wherein the indicator is one of a light and an audio device.

6. The method of claim 4, wherein the low pass filter and microprocessor are housed in an electronic trip unit coupled to the circuit breaker.

7. The method of claim 1, wherein the low pass filter is a fourth order low pass filter.

8. A power quality indicator coupled to an electric circuit to monitor harmonics, the power quality indicator comprising:
a summing device configured to receive a sensed waveform from the electric circuit, including at least one voltage waveform, and configured to provide a summed output voltage;
a low pass filter (LPF) electrically coupled to the summing device and configured to receive the summed output voltage from the summing device, and configured to provide a LPF voltage; and
a microprocessor configured to:
receive the summed output voltage and the LPF voltage,
compute an RMS voltage value for each of the summed output voltage and the LPF voltage,
determine the difference of such RMS voltage values, and
generate a signal representative of the difference of the two RMS voltage values, wherein the signal is proportional to the harmonic content in the electrical circuit.

9. The power quality indicator of claim 8, wherein the signal is provided to an electrical device.

10. The power quality indicator of claim 9, wherein the electrical device is a trip mechanism of a circuit breaker.

11. The power quality indicator of claim 10, wherein the low pass filter and microprocessor are housed in the electronic trip unit coupled to the circuit breaker.

12. The power quality indicator of claim 9, wherein the electrical device is one of a light and an audio device.

13. The power quality indicator of claim 8, wherein the low pass filter is a fourth order low pass filter.

14. A circuit breaker coupled to an electric circuit, the circuit breaker including an operating mechanism coupled to a movable contact, the circuit breaker comprising:
an electronic trip unit (ETU) coupled to the operating mechanism; and
a power quality indicator coupled to the electric circuit, the power quality indicator comprising:
a summing device configured to receive a sensed waveform from the electric circuit, including at least one voltage waveform, and configured to provide a summed output voltage;
a low pass filter (LPF) electrically coupled to the summing device and configured to receive the summed output voltage from the summing device, and configured to provide a LPF voltage; and
a microprocessor configured to:
receive the summed output voltage and the LPF voltage,
compute an RMS voltage value for each of the summed output voltage and the LPF voltage,
determine the difference of such RMS voltage values, and
generate a signal representative of the difference of the two RMS voltage values, wherein the signal is proportional to the harmonic content in the electrical circuit.

15. The circuit breaker of claim 14, wherein the signal is provided to an electrical device.

16. The circuit breaker of claim 15 wherein the electrical device is the ETU of the circuit breaker.

17. The circuit breaker of claim 16, wherein the low pass filter and microprocessor are housed in the electronic trip unit coupled to the circuit breaker.

18. The circuit breaker of claim 15 wherein the electrical device is one of a light and an audio device.

19. The circuit breaker of claim 14, wherein the low pass filter is a fourth order low pass filter.

20. The circuit breaker of claim 14, wherein the circuit breaker is a molded case circuit breaker.

21. A power quality indicator monitoring voltage of an electrical device connected to an power circuit, the power quality indicator comprising:
a board;
an electrical circuit mounted on the board and coupled to the electrical device and the power circuit, the electrical circuit includes a low pass filter (LPF) configured to provide a LPF voltage corresponding to the voltage drop across the LPF directly proportional to the degree of harmonic content sensed by electrical circuit in the power circuit; and
a signal device coupled to the electrical circuit configured to provide one of an audio indication, visual indication, and network instruction, wherein the electrical circuit includes a microprocessor configured to:
receive the summed output voltage and the LPF voltage,
compute an RMS voltage value for each of the summed output voltage and the LPF voltage,
determine the difference of such RMS voltage values,
generate a signal representative of the difference of the two RMS voltage values, wherein the signal is proportional to the harmonic content in the power circuit, and
provide the signal to the signal device.

22. The power quality indicator of claim 21, wherein the low pass filter is a fourth order low pass filter.

23. The power quality indicator of claim 21, wherein the electrical circuit includes a summing device configured to receive a sensed waveform from the power circuit including at least one voltage waveform, and configured to provide a summed output voltage to the LPF.

24. The power quality indicator of claim 21, wherein the signal device is mounted in a panel board.

* * * * *